(12) United States Patent
Park et al.

(10) Patent No.: US 7,067,377 B1
(45) Date of Patent: Jun. 27, 2006

(54) RECESSED CHANNEL WITH SEPARATED ONO MEMORY DEVICE

(75) Inventors: Jaeyong Park, Sunnyvale, CA (US); Hidehiko Shiraiwa, San Jose, CA (US); Satoshi Torii, Sunnyvale, CA (US); Mark T. Ramsbey, Sunnyvale, CA (US)

(73) Assignee: FASL LLC, Sunnyvale, CA (US)

( * ) Notice: Subject to any disclaimer, the term of this patent is extended or adjusted under 35 U.S.C. 154(b) by 85 days.

(21) Appl. No.: 10/812,703

(22) Filed: Mar. 30, 2004

(51) Int. Cl.
*H01L 21/336* (2006.01)

(52) U.S. Cl. ...................... 438/270; 438/435
(58) Field of Classification Search ............... None
See application file for complete search history.

(56) References Cited

U.S. PATENT DOCUMENTS

| | | | |
|---|---|---|---|
| 5,773,343 A | 6/1998 | Lee et al. | |
| 5,940,717 A * | 8/1999 | Rengarajan et al. | 438/435 |
| 6,225,173 B1 | 5/2001 | Yu | |
| 6,319,794 B1 * | 11/2001 | Akatsu et al. | 438/424 |
| 6,509,232 B1 * | 1/2003 | Kim et al. | 438/264 |
| 6,548,362 B1 * | 4/2003 | Wu | 438/304 |
| 6,781,191 B1 * | 8/2004 | Lin | 257/321 |
| 6,964,913 B1 * | 11/2005 | Dong et al. | 438/437 |

OTHER PUBLICATIONS

"A Novel 0.1 μm MOSFET Structure with Inverted Sidewall and Recessed Channel", Jeongho Lyu, Byung-Gook Park, Kukjin Chun and Jong Duk Lee, IEEE Electron Device Letters, vol. 17, No. 4, Apr. , 1996, pp. 157-159.
"Short-Channel Effect Immunity and Current Capability of Sub-0.1-Micron MOSFET's Using a Recessed Channel", Paul-Hanri Bricout and Emmanuel Dubois, IEEE Transactions on Electron Devices, vol. 43, No. 8, Aug., 1996, pp. 1251-1255.
"The Investigation of Recessed Channel SOI Devices", Xing Zhang, Ru Huang, Xuemei Xi, Mansun Chan Ping K. Ko and Yangyuan Wang, IEEE, 1998, pp. 720-723.

* cited by examiner

*Primary Examiner*—Alonzo Chambliss
(74) *Attorney, Agent, or Firm*—Eschweiler & Associates, LLC

(57) ABSTRACT

Systems and methods of fabricating a U-shaped memory device with a recessed channel and a segmented/separated ONO layer are provided. Multibit operation is facilitated by a separated ONO layer, which includes a charge trapping region on sidewalls of polysilicon gate structures adjacent to source/drain regions. Programming and erasing of the memory cells is facilitated by the relatively short distance between acting source regions and the gate. Additionally, short channel effects are mitigated by a relatively long U-shaped channel region that travels around the recessed polysilicon gate thereby adding a depth dimension to the channel length.

18 Claims, 14 Drawing Sheets

RECESSED CHANNEL WITH SEPARATED ONO MEMORY DEVICE

FIELD OF INVENTION

The present invention relates generally to memory devices and the like, and in particular fabricating a U-shaped memory device that has a recessed channel with a separated ONO layer thereby facilitating scaling and increased packing density.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells in such structures are generally programmed by hot electron injection and erased by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The single bit memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

Another memory technology is dual bit memory, which allows multiple bits to be stored in a single cell. In this technology, a memory cell is essentially split into two substantially identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, some forms of dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being interchanged in another arrangement.

As device sizes and features are continually scaled down, however, leakage currents, cross talk and other issues can arise. Limitations in photoresists and other materials and/or techniques utilized in patterning the semiconductor substrate as well as other materials out of which the memory cells are fashioned can, for example, limit the size to which some features, such as wordlines and/or bitlines, can be reduced.

One technique to pack more cells into a smaller area is to form the structures (e.g., individual memory cells) closer together. Forming bitlines, for example, closer together shortens the length of the channel defined therebetween. Shortening the channel in such a manner can, however, lead to short channel effects such as leakage currents as well as other undesirable performance issues. For example, charge or bit isolation between the two bits stored in the charge trapping layer (e.g., nitride) becomes increasingly difficult as the channel length is decreased and the bits are brought closer together. In this manner, cross-talk can occur, the bits can contaminate one another and operations performed on one bit can affect the other bit (sometimes referred to complimentary bit disturb or CBD). Accordingly, it would be desirable to reduce feature sizes so as to increase packing density while mitigating the adverse affects that may result therefrom.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention provides systems and methods of fabricating a U-shaped memory device with a recessed channel and a segmented/separated ONO layer. Multibit operation is facilitated by the separated ONO layer, which includes a charge trapping region on sidewalls of polysilicon gate structures adjacent to source/drain regions. Programming and erasing of the memory cells is facilitated by the relatively short distance between acting source regions and the charge trapping regions associated with gate. Furthermore, short channel effects are mitigated by a relatively long U-shaped channel region that travels around the recessed polysilicon gate thereby adding a depth dimension to the channel length. This feature advantageously reduces short channel effects without sacrificing memory cell packing density.

The U-shaped memory device of the present invention can be fabricated by forming recessed polysilicon gate structures. Gap regions are then created on sidewalls of the recessed polysilicon gate structure, wherein the gap regions are also adjacent to bitlines or source/drain regions. The gap regions are then filled with a charge trapping layer such as oxide-nitride-oxide (ONO). A second polysilicon layer can be selectively formed over the device to operate as wordlines and contacts can be formed to access the bit lines and thereby facilitate programming and reading the individual memory cells.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
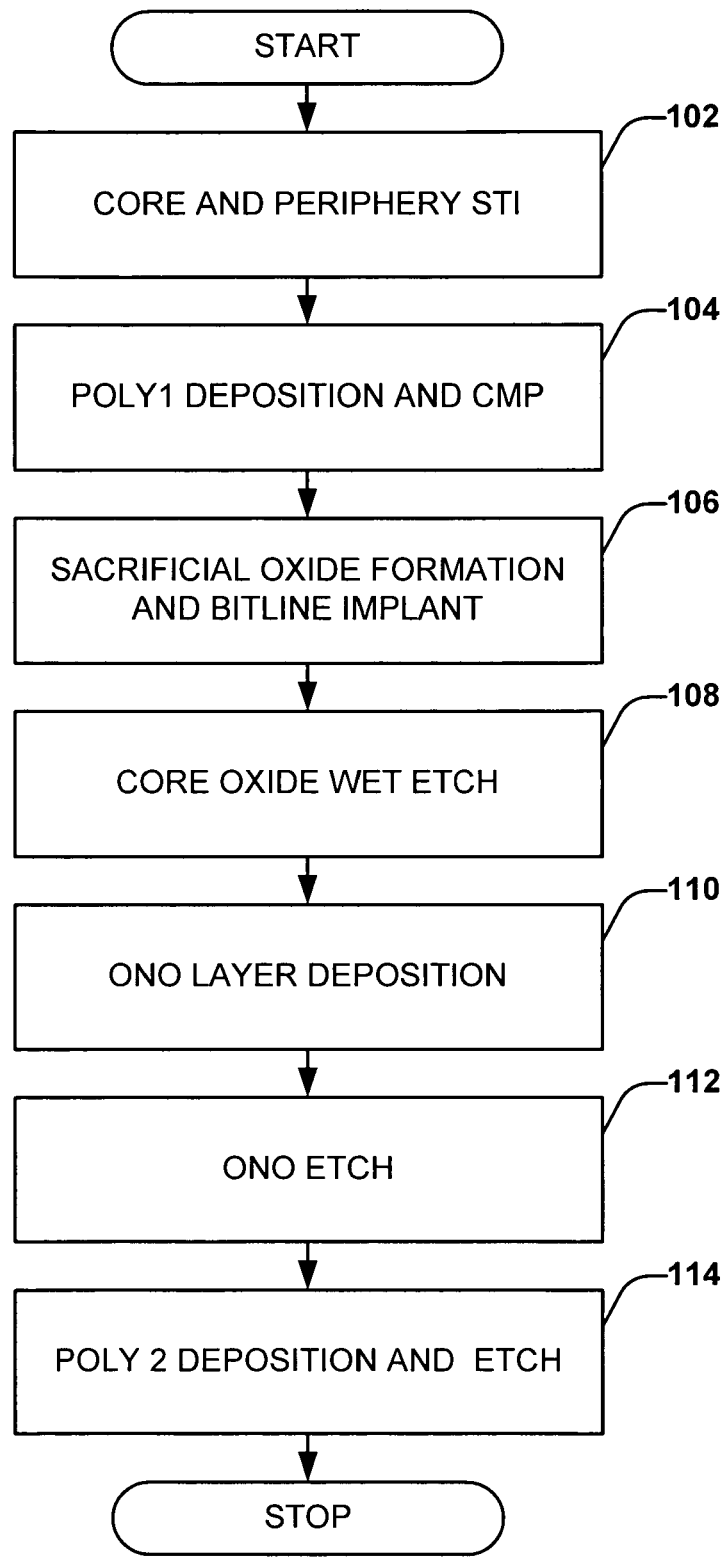
FIG. 1 is flow diagram illustrating a method of fabricating a memory device in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention provides systems and methods of fabricating a U-shaped memory device with a recessed channel and a segmented/separated ONO layer. The memory device mitigates short channel effects, has improved scalability, and can be fabricated with a higher density than conventional memory devices (e.g., MOS devices). Multibit operation is facilitated by the separated ONO layer, which includes a charge trapping region on sidewalls of polysilicon gate structures adjacent to source/drain regions. Programming and erasing of the memory cells is facilitated by the relatively short distance between acting source regions and the gate. Furthermore, short channel effects are mitigated by a relatively long U-shaped channel region that travels around the recessed polysilicon gate thereby adding a depth dimension to the channel length.

FIG. 1 is flow diagram illustrating a method of fabricating a memory device in accordance with an aspect of the present invention. The method is described in conjunction with FIGS. 2–15 that illustrate structure during fabrication in order to further illustrate the present invention. However, it is appreciated that variations in structure are permitted in accordance with the method of FIG. 1 and the present invention.

The method begins at block 102 wherein oxide and nitride layers are formed in a core region and wherein shallow trench isolation regions (STI) are formed within the periphery region. Generally, a source/drain pad oxidation layer is formed on a semiconductor substrate. Then, a silicon nitride layer (SiN) having a selected thickness is formed on the oxidation layer followed by a anti-reflective coating (ARC). A periphery STI mask is applied to "open" selected areas within the periphery region and then etch trenches in the selected areas to a depth. The deposited mask (resist) is then stripped and a liner oxide is formed. The trenches are filled with an HDP oxide fill process to form the shallow trench isolation regions. Subsequently, a trench polish is performed and, afterward, a clean operation is performed (e.g., HF clean).

Figure 2:
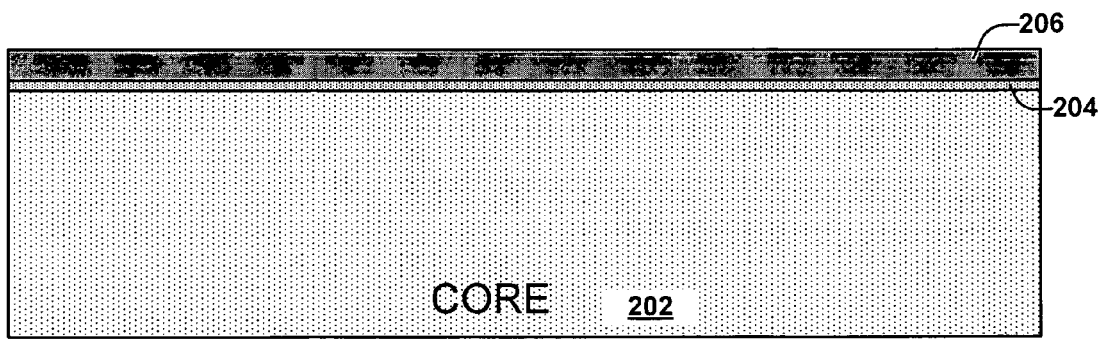
FIG. 2. is a cross sectional diagram that further illustrates the method of FIG. 1 by depicting the core region of device at a stage of fabrication in accordance with an aspect of the present invention.
Figure 3:
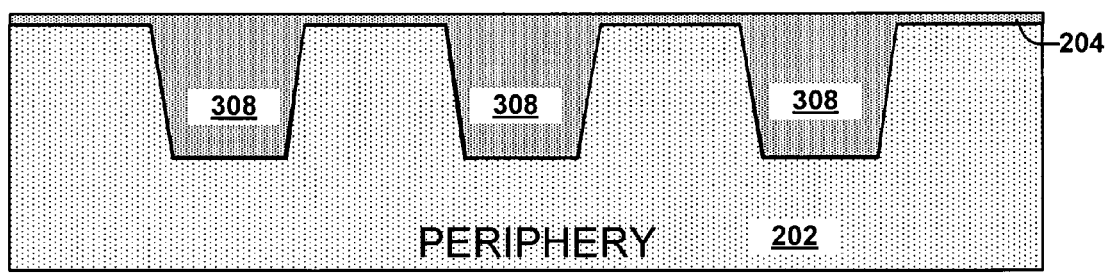
FIG. 3. is a cross sectional diagram that further illustrates the method at FIG. 1 by depicting the periphery region of the device at a stage of fabrication in accordance with an aspect of the present invention.

FIG. 2. further illustrates the method at block 102 by depicting the core region of device at this stage of fabrication in accordance with an aspect of the present invention. Here, the oxide layer 204 is shown formed on the semiconductor substrate 202 and the silicon nitride layer 206 is formed on the oxide layer 204. FIG. 3. further illustrates the method at block 102 by depicting the periphery region of the device at this stage of fabrication in accordance with an aspect of the present invention. The periphery region also has the oxide layer 204 formed on the substrate 202. Further, the periphery layer has the shallow trench isolation regions 308 formed in the substrate 202 as described above.

Continuing at block 104 of FIG. 1, a first poly layer is deposited and a planarization process is performed on the device to form gate structures within the core region. Initially at block 104 a core region S/D mask is applied. Core trenches are then etched in the substrate 202. The mask/resist is then stripped by a suitable process. A sacrificial oxide layer can be grown and then removed. An oxide layer is grown (e.g., by a high thermal oxidation process) that combines with the existing oxide layer 204 to also cover exposed surfaces of the core trenches. The first polysilicon layer (doped or undoped) is then deposited within the core region followed by a planarization process that removes the polysilicon from areas not within the trench areas of the core region. The planarization process stops on the silicon nitride layer 206.

Figure 4:
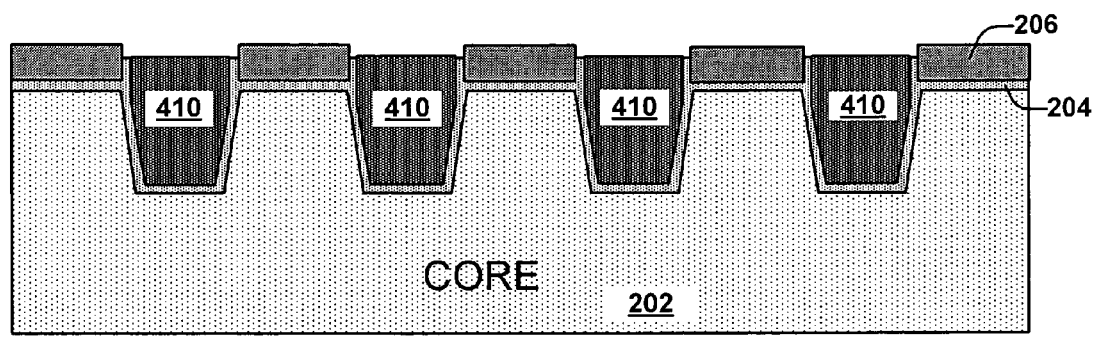
FIG. 4. is a cross sectional diagram that further illustrates the method of FIG. 1 by depicting the core region of device at a stage of fabrication in accordance with an aspect of the present invention.
Figure 5:
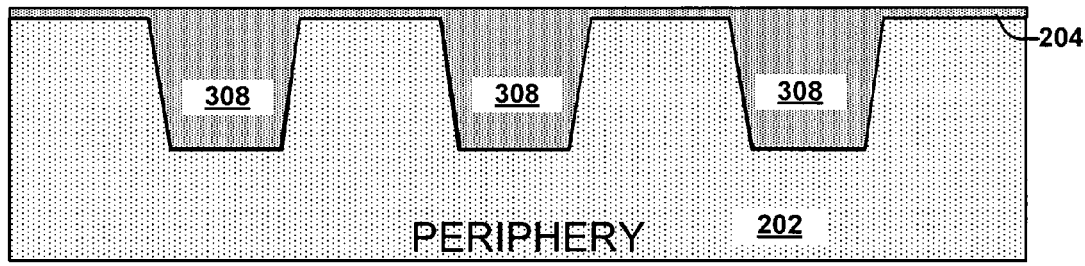
FIG. 5. is a cross sectional diagram that further illustrates the method at FIG. 1 by depicting the periphery region of the device at a stage of fabrication in accordance with an aspect of the present invention.

FIGS. 4 and 5 depict the device after the block 104 of the method has been performed. FIG. 4. illustrates the core region of the device at this stage of fabrication in accordance with an aspect of the present invention and FIG. 5 illustrates the periphery region of the device at this stage of fabrication in accordance with an aspect of the present invention. FIG. 4 shows the first polysilicon layer in the core trenches as recessed polysilicon gates 410 formed in substrate 202 of the core region, wherein such regions 410 will operate as memory cell gates as will be further appreciated below. FIG. 5 remains substantially unchanged from FIG. 3.

The silicon nitride layer 206 is removed from the device and bitlines are formed within the core region at block 106. For example, the silicon nitride layer 206 is removed from the device via a suitable removal process. Subsequently, a bitline implant of an n-type dopant at a relatively low energy is performed within the core region with a mask that exposes the core region while covering the periphery region.

Figure 6:
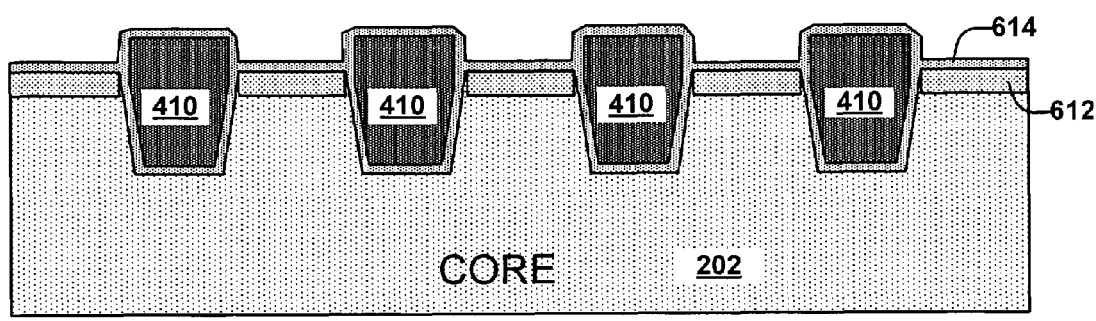
FIG. 6. is a cross sectional diagram that further illustrates the method of FIG. 1 by depicting bitline formation within the core region of device at a stage of fabrication in accordance with an aspect of the present invention.
Figure 7:
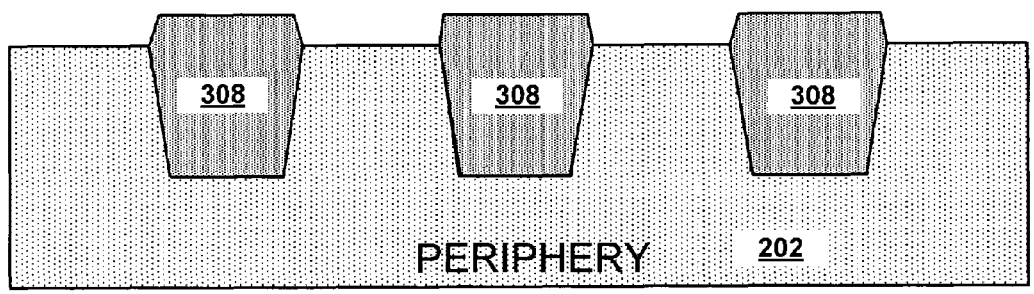
FIG. 7. is a cross sectional diagram that further illustrates the method at FIG. 1 by depicting the periphery region of the device at a stage of fabrication in accordance with an aspect of the present invention.

FIGS. 6 and 7 show the device after the block 106 of the method has been completed. FIG. 6. illustrates the core region of the device at this stage of fabrication in accordance with an aspect of the present invention and FIG. 7 illustrates the periphery region of the device at this stage of fabrication in accordance with an aspect of the present invention. In FIG. 6, bitlines 612 (source/drain regions) are formed as a result of the bitline implant and a sacrificial oxide layer 614 is shown covering the surface of the core region.

Figure 8:
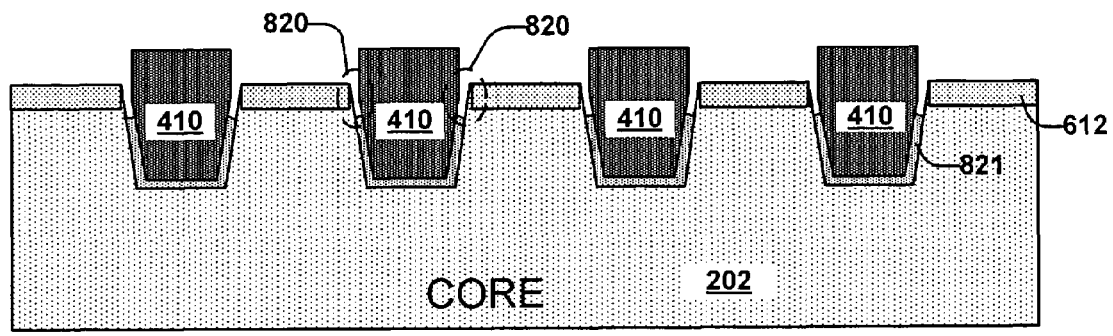
FIG. 8. is a cross sectional diagram that further illustrates the method of FIG. 1 by depicting the core region of device at a stage of fabrication in accordance with an aspect of the present invention.
Figure 9:
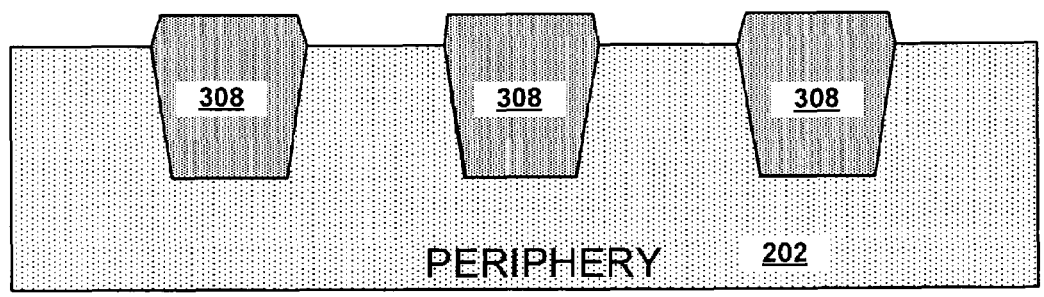
FIG. 9. is a cross sectional diagram that further illustrates the method at FIG. 1 by depicting the periphery region of the device at a stage of fabrication in accordance with an aspect of the present invention.

Continuing with the method at block 108, a wet oxide etch is performed in the core region to create gaps on sides of the first poly gates 410. The oxide wet etch removes oxide from an upper portion of the core trenches to create gaps 820 shown in FIG. 8, which illustrates the core region of the device at this stage of fabrication in accordance with the present invention. Oxide remaining in the trenches is referred to as trench oxide 821. The gaps 820 are formed between the n+ bitlines 612 and the poly gates 410 and extend below the bitlines as shown in FIG. 8. The wet etch is performed for a suitable time period to create the gaps 820 without removing too much of the oxide in the core trenches. FIG. 9 depicts the periphery region of the device at this stage of fabrication in accordance with an aspect of the present invention.

A bottom oxide and nitride layer are formed across the device at block 110. A bottom oxide layer is formed by an oxidation process such as a conventional thermal oxidation, ISSG, or radical oxidation are possible that also forms the oxide within the gaps 820 of FIG. 8. The nitride layer is formed on the bottom oxide layer and also forms within the gaps 820 of FIG. 8.

Figure 10:
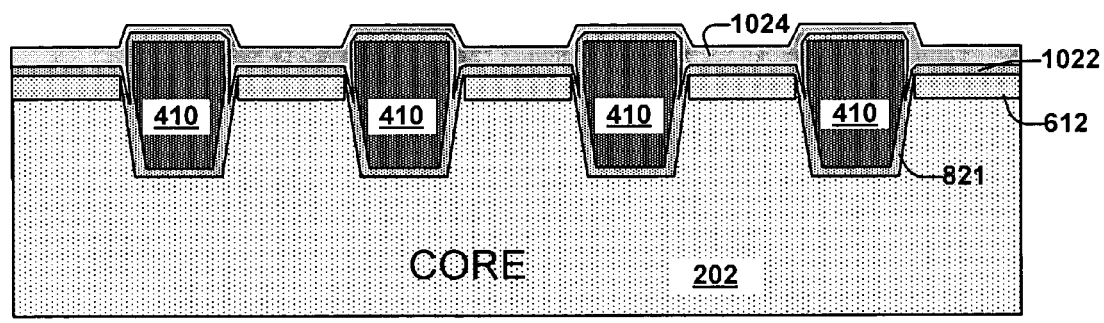
FIG. 10. is a cross sectional diagram that further illustrates the method of FIG. 1 by depicting the core region of device at a stage of fabrication in accordance with an aspect of the present invention.
Figure 11:
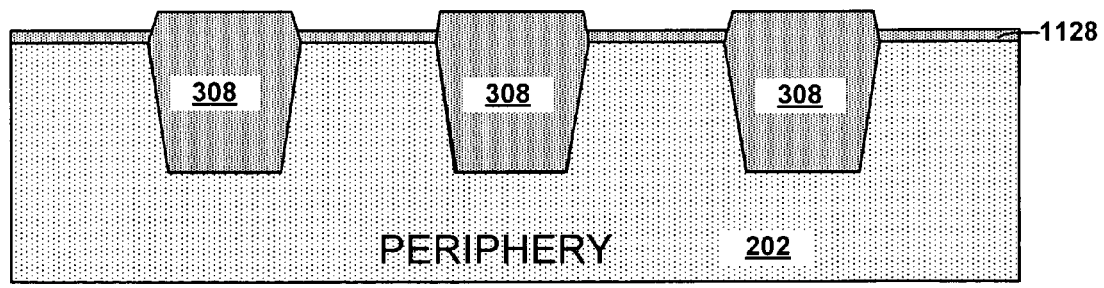
FIG. 11. is a cross sectional diagram that further illustrates the method at FIG. 1 by depicting the periphery region of the device at a stage of fabrication in accordance with an aspect of the present invention.

FIGS. 10 and 11 illustrate the device at this stage of fabrication. FIG. 10 depicts the core region in accordance with an aspect of the present invention and shows the bottom oxide layer 1022 within the core region and the nitride layer 1024 formed on the bottom oxide layer 1022 and within the gaps on sides of the polysilicon gates 410. FIG. 11 depicts the periphery region in accordance with an aspect of the present invention at this stage of fabrication. FIG. 11 illustrates formation of the bottom oxide 1128 within the periphery region.

Figure 12:
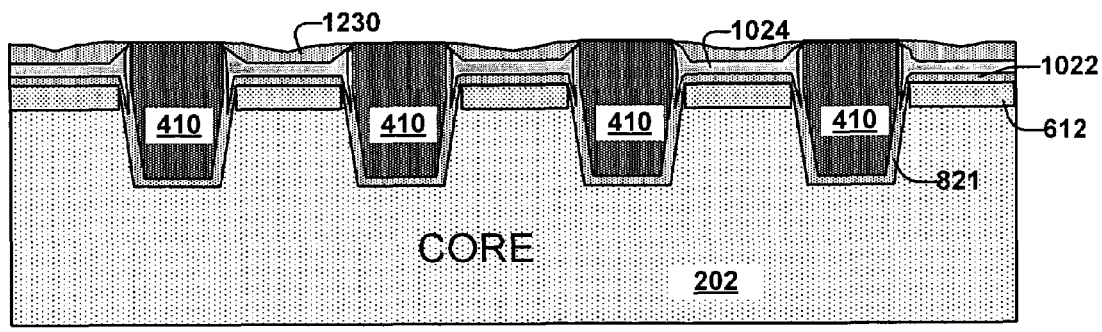
FIG. 12. is a cross sectional diagram that further illustrates the method of FIG. 1 by depicting the core region of device at a stage of fabrication in accordance with an aspect of the present invention.
Figure 13:
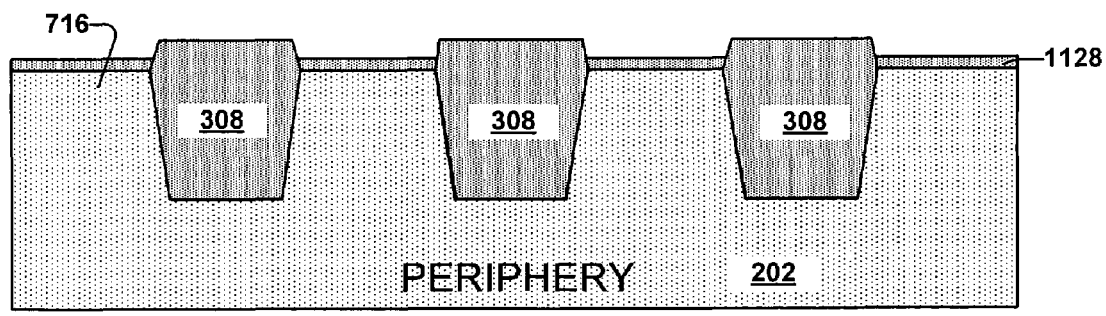
FIG. 13. is a cross sectional diagram that further illustrates the method at FIG. 1 by depicting the periphery region of the device at a stage of fabrication in accordance with an aspect of the present invention.

An upper oxide layer is deposited and an ONO etch is performed at block 112. The upper oxide layer is deposited on the nitride layer 1024 within the core region. FIGS. 12 and 13 illustrate the device after the ONO etch at this stage of fabrication. The upper oxide layer 1230 is shown formed on the nitride layer 1022 within the core region. The ONO layer, which comprises the lower oxide 1022, nitride 1024, and upper oxide 1230 layers, is selectively removed from portions of the core region and is substantially removed from the periphery region. It is appreciated that alternate aspects of the invention include forming a high-k dielectric film (e.g., aluminum oxide, halfnium oxide, and the like), which can facilitate F-N erase.

Continuing with the method of FIG. 1, a second polysilicon layer is deposited on the device followed by an application of suitable anti-reflective coating material. The gate is then patterned and etched using a plasma etch process with high selectivity to oxide at block 114.

Figure 14:
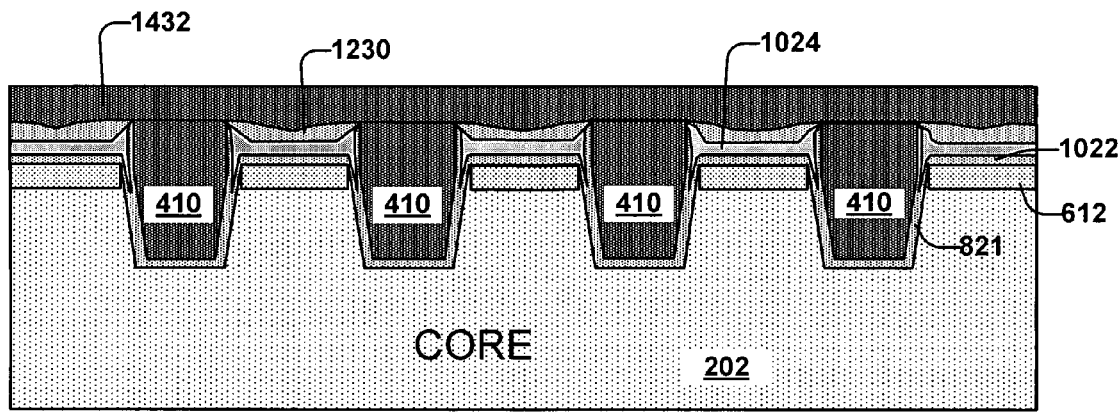
FIG. 14. is a cross sectional diagram that further illustrates the method of FIG. 1 by depicting the core region of device at a stage of fabrication in accordance with an aspect of the present invention.
Figure 15:
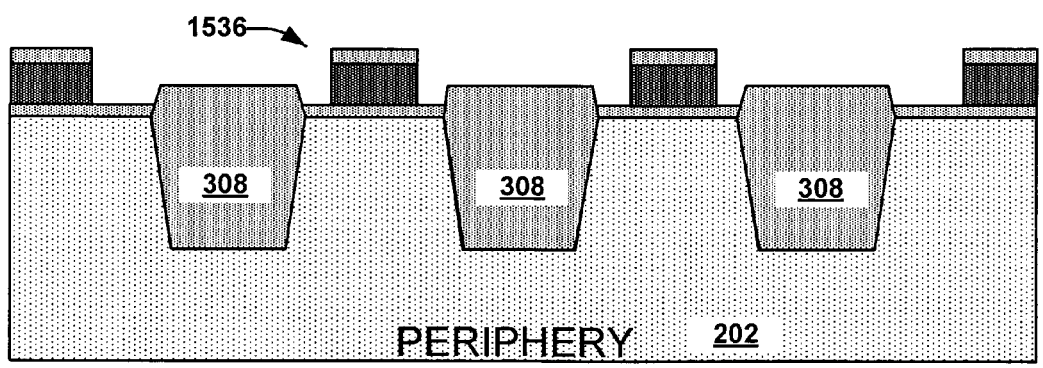
FIG. 15. is a cross sectional diagram that further illustrates the method at FIG. 1 by depicting the periphery region of the device at a stage of fabrication in accordance with an aspect of the present invention.

FIG. 14 is a diagram illustrating the core region of the device at this stage of fabrication in accordance with an aspect of the present invention. The second polysilicon layer 1432 is shown formed on the device. Turning to FIG. 15, a diagram illustrating the periphery region of the device at this stage of fabrication wherein periphery gates are formed in accordance with an aspect of the present invention is provided. FIG. 15 shows periphery gate structures 1536 formed in the periphery region.

After the second polysilicon layer is deposited, standard U-shaped memory processing can be performed to complete fabrication of the device. It is appreciated that variation in processes employed and order performed are contemplated by the present invention so long as separated ONO layers for cells in the core region are obtained.

It is appreciated that the methodology of FIG. 1 described above can be better appreciated with reference to the above FIGS. 2–15 and those provided below. While, for purposes of simplicity of explanation, the methodology described above is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 16:
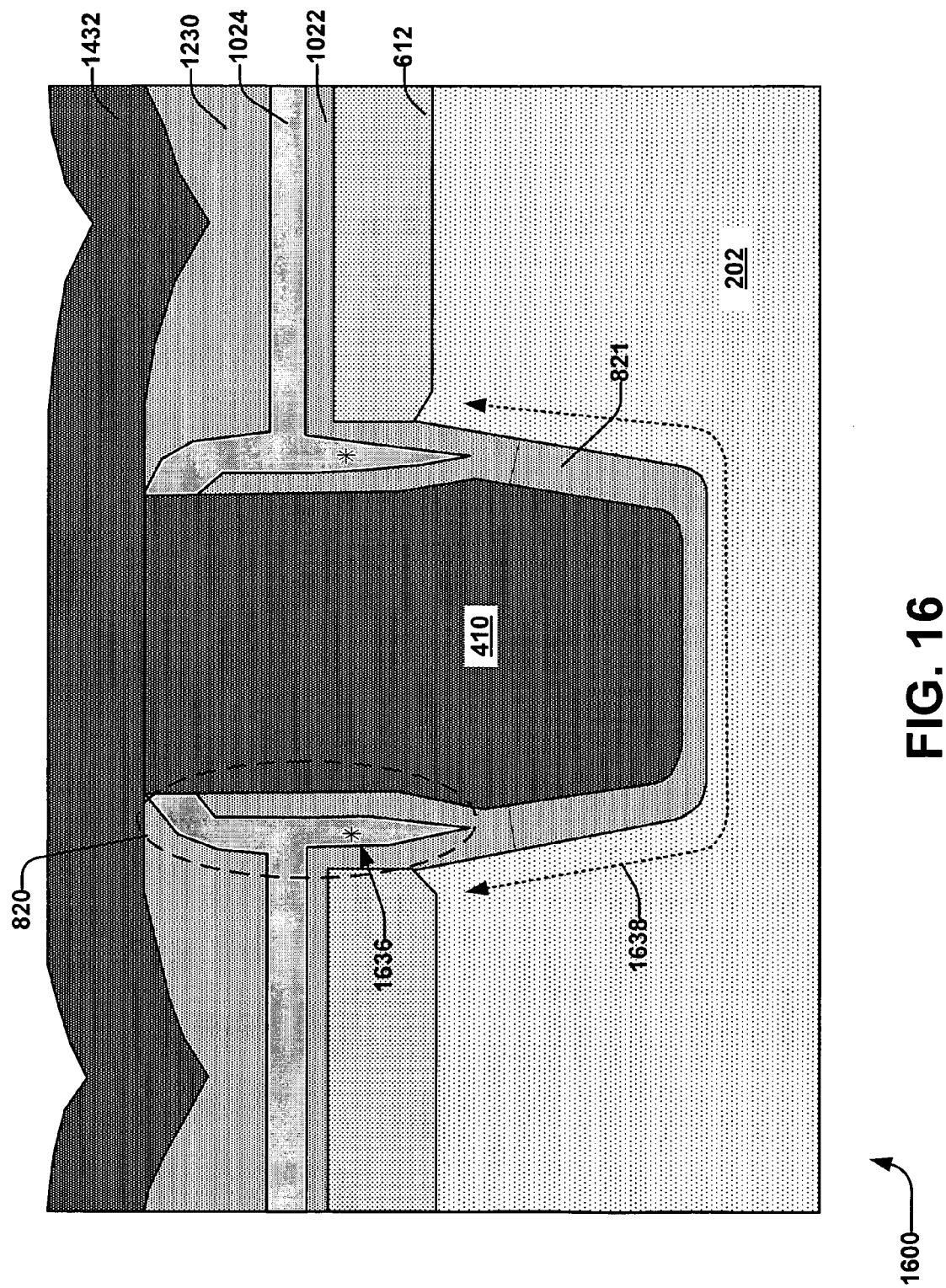
FIG. 16. is a detailed close up diagram illustrating a memory cell in accordance with an aspect of the present invention.

FIG. 16 is a diagram illustrating a close up view of a core memory cell 1600 in accordance with an aspect of the present invention. The memory cell can be fabricated by the method of FIG. 1 as described above. The memory cell includes bitlines (source/drain regions) 612 and a polysilicon gate 410 formed in a semiconductor substrate 202. The polysilicon gate 410 is comprised of doped or undoped polysilicon. A separated ONO layer, comprised of a lower oxide layer 1022, a nitride layer 1024, and an upper oxide layer 1230, provides charge trapping regions 1636 as indicated that extend to a depth below the bitlines. A second polysilicon layer 1432, comprised of doped or undoped polysilicon, is on the device and can be employed to couple together multiple memory cells along a given word line. The memory cell 1600 is fabricated with a U-shaped channel 1638 that extends from one source/drain region 612 to another and travels below the core gate structure 410. The U-shaped channel is relatively longer than a conventional straight channel.

The memory cell 1600 is relatively more scalable than conventional memory devices because of the separated ONO layer and the recessed channel, which mitigate short channel effects. Because the U-shaped channel 1638 also uses the depth of the core trench in addition to a spatial distance between source/drain regions, the effective channel length is substantially longer for the memory cell 1600 than for a similarly sized conventional memory cell. As a result, a greater than 50% reduction in size can be achieved by the memory cell 1600 without incurring degradation due to short channel effects. Additionally, the core trench can be made deeper to obtain a longer channel length. The separated ONO layer also facilitates data retention as compared with continuous ONO layers. The memory cell 1600 also has a relatively faster program speed because the trajectory of the electrons favoring the injection, due to formation of the "bump" at the recessed region between the 612 and 1636, due to consumption of silicon in 1636 during oxidation. Further, the memory cell 1600 provides relatively less complementary bit disturbance (CBD), relatively large contact alignment tolerance (see FIG. 19, infra), relatively longer cycle endurance, lower production cost, reliability, increase in operating temperature range, reduced power consumption, and multibit capability (2 or more bits).

The memory cell 1600 can programmed by applying a program voltage across the gate and an acting drain region (one of the bitlines 612) and connecting an acting source region to ground. The acting drain region is typically biased to a potential above the acting source. As a result, a high electric field is applied across the charge trapping region 1636, which permits programming via hot electron injection. As a result of the trapped electrons, the threshold voltage of the memory cell is modified. A second bit can programmed to the cell by reversing the acting source and drain. Additional bits can be programmed by applying varied program voltages that correspond to different "bit" values.

In order to erase the memory cell 1600, a relatively high voltage is applied to an acting source and the polysilicon gate 410 is held at a negative potential, while an acting drain is allowed to float. As a result, a strong electric field develops across the charge trapping region 1636 that causes electrons trapped in the trapping region to return to the acting source. As the electrons are removed from the charge trapping region 1636, the memory cell is erased. Hot hole injection can be used to erase the cells.

For a read operation, a certain voltage bias is applied across an acting drain to an acting source of the cell transistor. The acting drain of the cell is the bitline, which may be connected to the drains of other cells in a byte or word group. A voltage is then applied to the gate 410 (e.g., the wordline) of the memory cell 1600 in order to cause a current to flow from the acting drain to the acting source. The read operation gate voltage is typically applied at a level between a programmed threshold voltage (VT) and an unprogrammed threshold voltage. The resulting current is measured, by which a determination is made as to the data value stored in the cell. A second bit can be read by reversing operations of the acting drain and the acting source. Additionally bits can be read by applying multiple/varied read voltages and/or measuring the current, wherein the measured current corresponds to different bit values.

Figure 17:
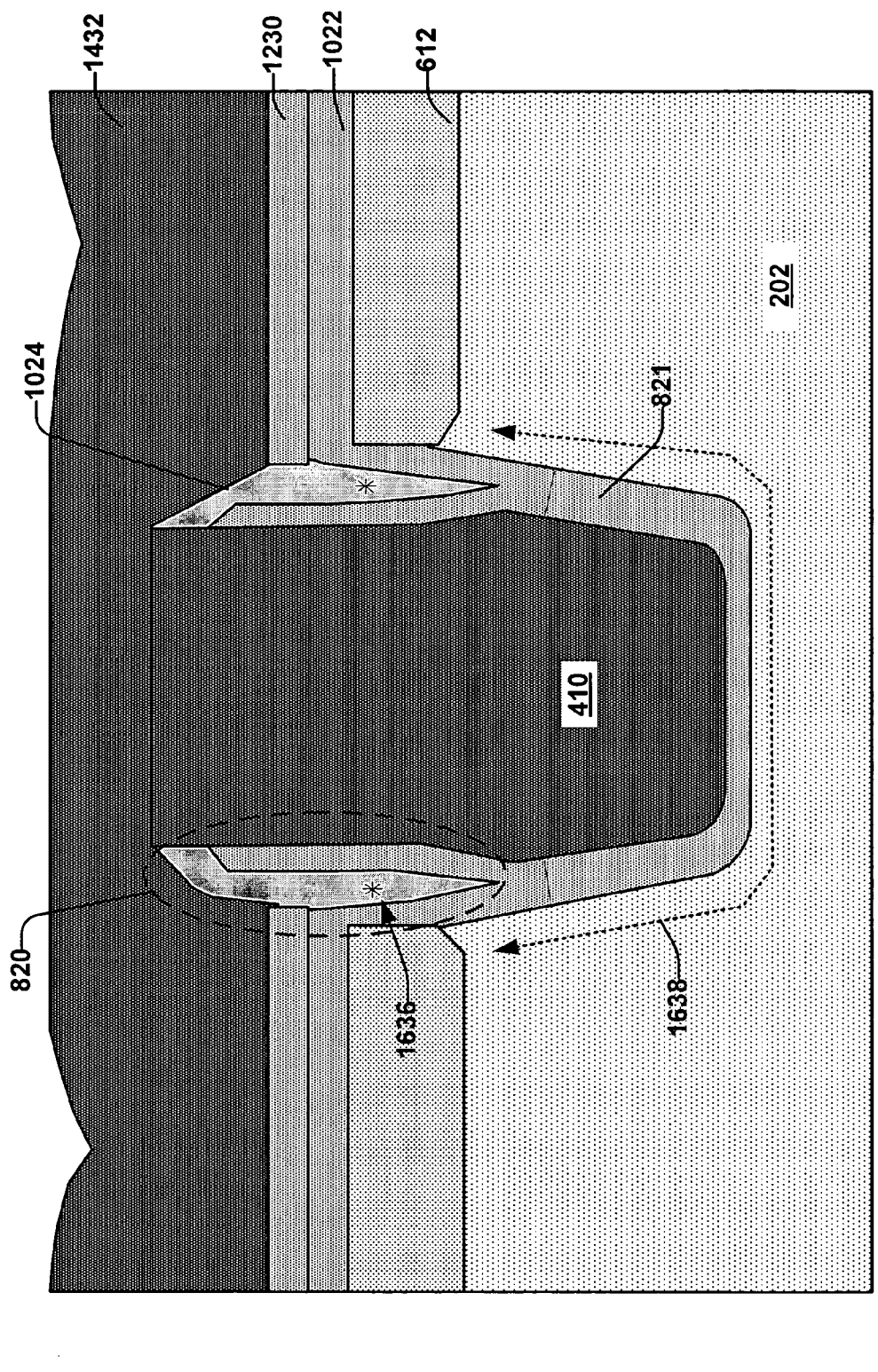
FIG. 17. is a detailed close up diagram illustrating a memory cell with another configuration in accordance with an aspect of the present invention.

FIG. 17 is a diagram illustrating a close up view of a core memory cell 1700 with another configuration in accordance with an aspect of the present invention. The memory cell can be fabricated substantially by the method of FIG. 1 as described above. The memory cell 1700 includes bitlines (source/drain regions) 612 and a polysilicon gate 410 formed in a semiconductor substrate 202. A separated ONO layer, comprised of a lower oxide layer 1022, a nitride layer 1024, and an upper oxide layer 1230, provides charge trapping regions 1636 as indicated that extend to a depth below the bitlines. However, in the configuration of FIG. 17, the nitride layer 1024 is only present within the gap regions 820. A second polysilicon layer 1432, comprised of doped or undoped polysilicon, is on the device. The memory cell 1600 is fabricated with a U-shaped channel 1638 that extends from one source/drain region 612 to another and travels below the core gate structure 410. The U-shaped channel is relatively longer than a conventional straight channel.

The memory cell 1700 is substantially similar to that of the memory cell 1600 of FIG. 16. However, the different ONO configuration provides laterally isolated nitrides as the charge-trapping layer, which improves data retention by preventing any charge migration laterally out of the desired area.

Figure 18:
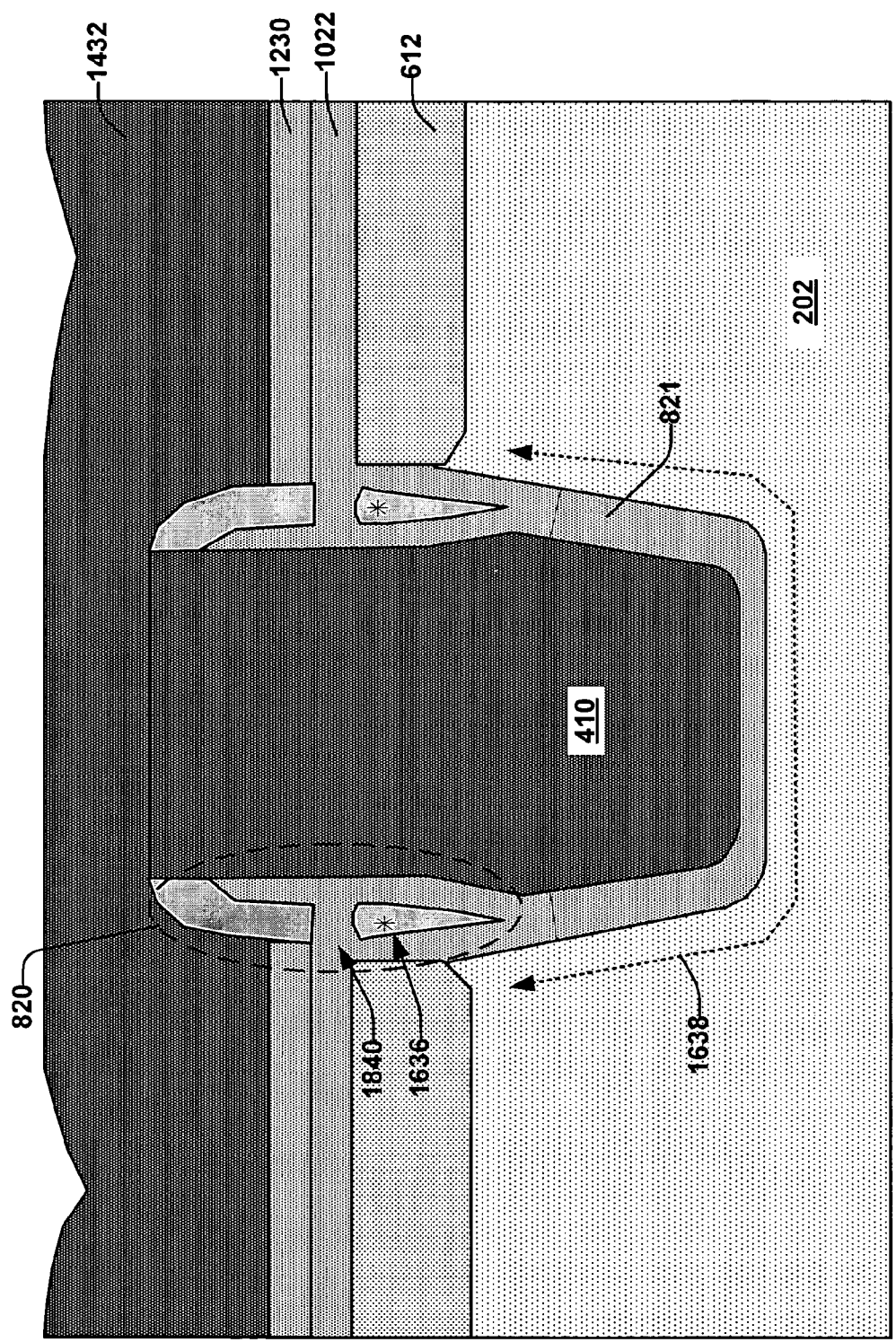
FIG. 18. is a detailed close up diagram illustrating a memory cell with yet another configuration in accordance with an aspect of the present invention.

FIG. 18 is a diagram illustrating a close up view of a core memory cell 1800 with yet another configuration in accordance with an aspect of the present invention. The memory cell 1800 can also be substantially fabricated by the method of FIG. 1, as described above. The memory cell 1800 includes bitlines (source/drain regions) 612 and a polysilicon gate 410 formed in a semiconductor substrate 202. The polysilicon gate 410 is comprised of doped or undoped polysilicon. A separated ONO layer, comprised of a lower oxide layer 1022, a nitride layer 1024, and an upper oxide layer 1230, provides charge trapping regions 1636 as indicated that extend to a depth below the bitlines. Like the configuration of FIG. 17, the nitride layer 1024 of the memory cell 1800 is only present within the gap regions 820. However, a nitride gap 1840 is present that separates the nitride layer 1024 into an upper and lower portion. The nitride gap 1840 can be formed by depositing only a lower portion of the nitride layer 1024, subsequently depositing oxide or another insulative material, and then depositing the remaining portion of the nitride layer 1024. A second polysilicon layer 1432 is on the device. The memory cell 1600 is fabricated with a U-shaped channel 1638 that extends from one source/drain region 612 to another and travels below the core gate structure 410. The U-shaped channel is relatively longer than a conventional straight channel due to the presence of the polysilicon gate 410 in the core trench.

The memory cell 1800 is substantially similar to that of the memory cell 1700 of FIG. 17. However, the gap in the nitride layer 1024 provides completely isolated nitrides as the charge-trapping layer, which improves data retention by preventing any charge migration (both lateral and vertical) out of the desired area, but with added process steps.

Figure 19:
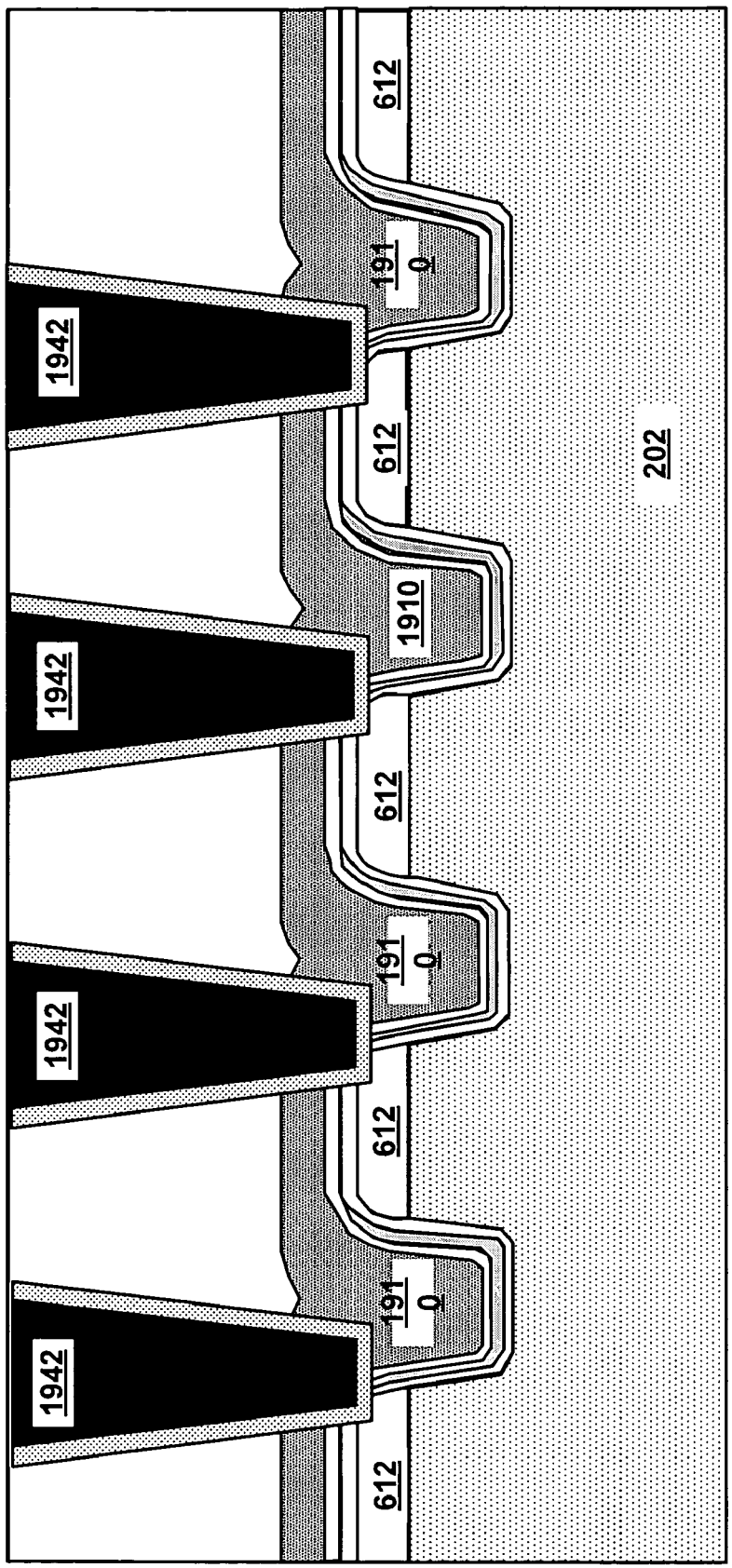
FIG. 19 is a diagram illustrating contact formation and alignment in a core region of a memory device in accordance with an aspect of the present invention.

Turning now to FIG. 19 is a diagram illustrating a core region of a memory device in accordance with an aspect of the present invention. The memory device has substantially completed fabrication and has contacts 1942 formed that contact bitlines 1612. A nitride layer 1910 is present and fills core trenches. The diagram is somewhat simplified so as illustrate alignment tolerance between contacts 1942 and bitlines (source/drain regions) 612. As can be seen, a relatively substantial mis-alignment can occur and still provide a suitable contact to the bitlines 612.

It is appreciated that the methodologies of FIGS. 20–21, described below, can be better appreciated with reference to the above FIGS. 1–19. While, for purposes of simplicity of explanation, the methodologies described below are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 20:
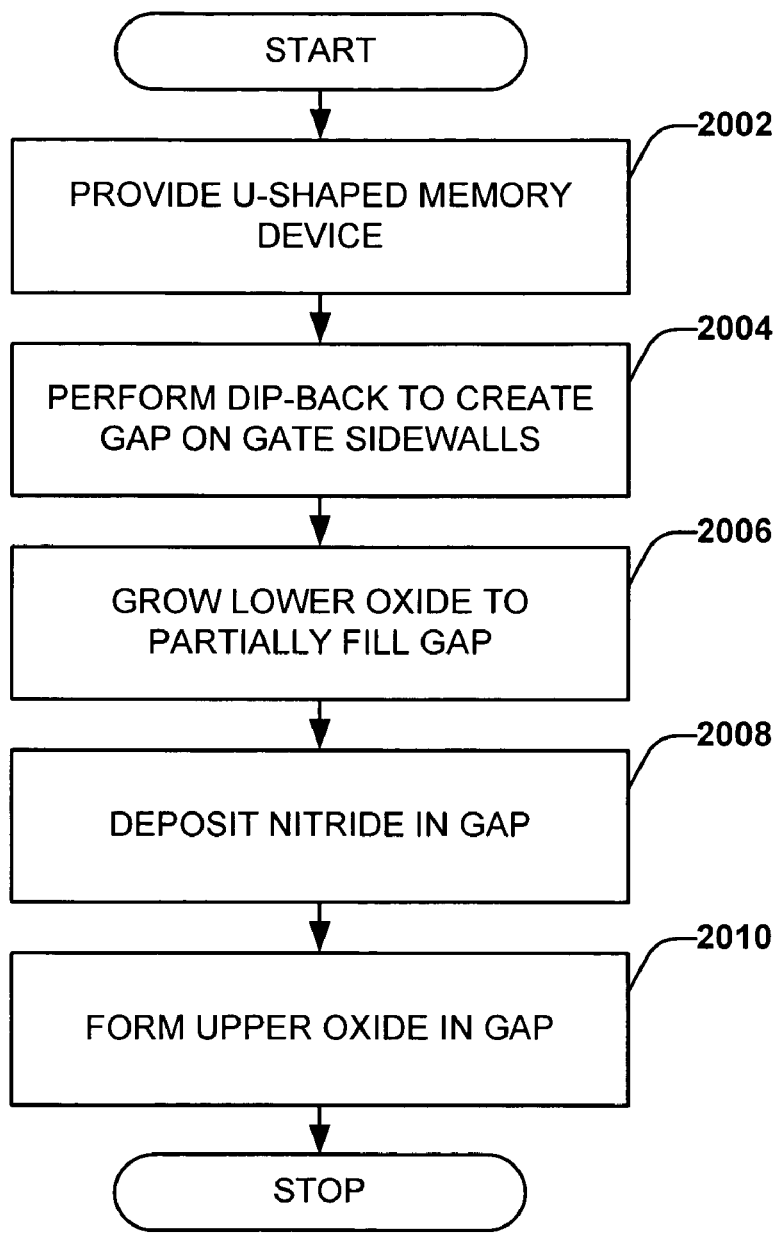
FIG. 20 is a flow diagram illustrating a method of forming and filling a gap region for a separated ONO U-shaped memory device in accordance with an aspect of the present invention.

FIG. 20 is a flow diagram illustrating a method of forming and filling a gap region for a separated ONO U-shaped memory device in accordance with an aspect of the present invention. The method operates on a partially fabricated U-shaped memory device before ONO layer formation to form gap regions and then fill the gap regions with an ONO layer.

The method begins at block 2002 wherein a U-shaped memory device is provided. The device has a polysilicon gate formed within a trench between adjacent source/drain regions. An oxide layer covers a surface of the device and sides and bottom of the polysilicon gates. A wet etch process, also referred to as a "dip back", is performed at block 2004 for a selected period of time to substantially remove the oxide layer from the surface and to remove the oxide layer to a selected depth on the sidewalls of the polysilicon gate created a gap on the sidewalls. The time is selected to obtain the desired, selected depth.

Subsequently, a lower oxide layer is grown for a selected period of time that partially fills the gap with the lower oxide layer and covers the surface of the device at block 2006. Nitride is then deposited into the gap by a suitable directed etch process such as chemical vapor deposition (CVD) or low pressure chemical vapor deposition (LPCVD) at block 2008. The nitride may also be deposited over the surface of the device substantially covering the lower oxide deposited previously. An upper oxide layer is then formed on the device thereby covering the deposited nitride in the gap at block 2010, thereby substantially yielding the structure provided in FIG. 16. In alternate aspects of the invention, the nitride is deposited in two separate steps with an oxidation process in between to form the nitride gaps depicted in FIG. 18.

Figure 21:
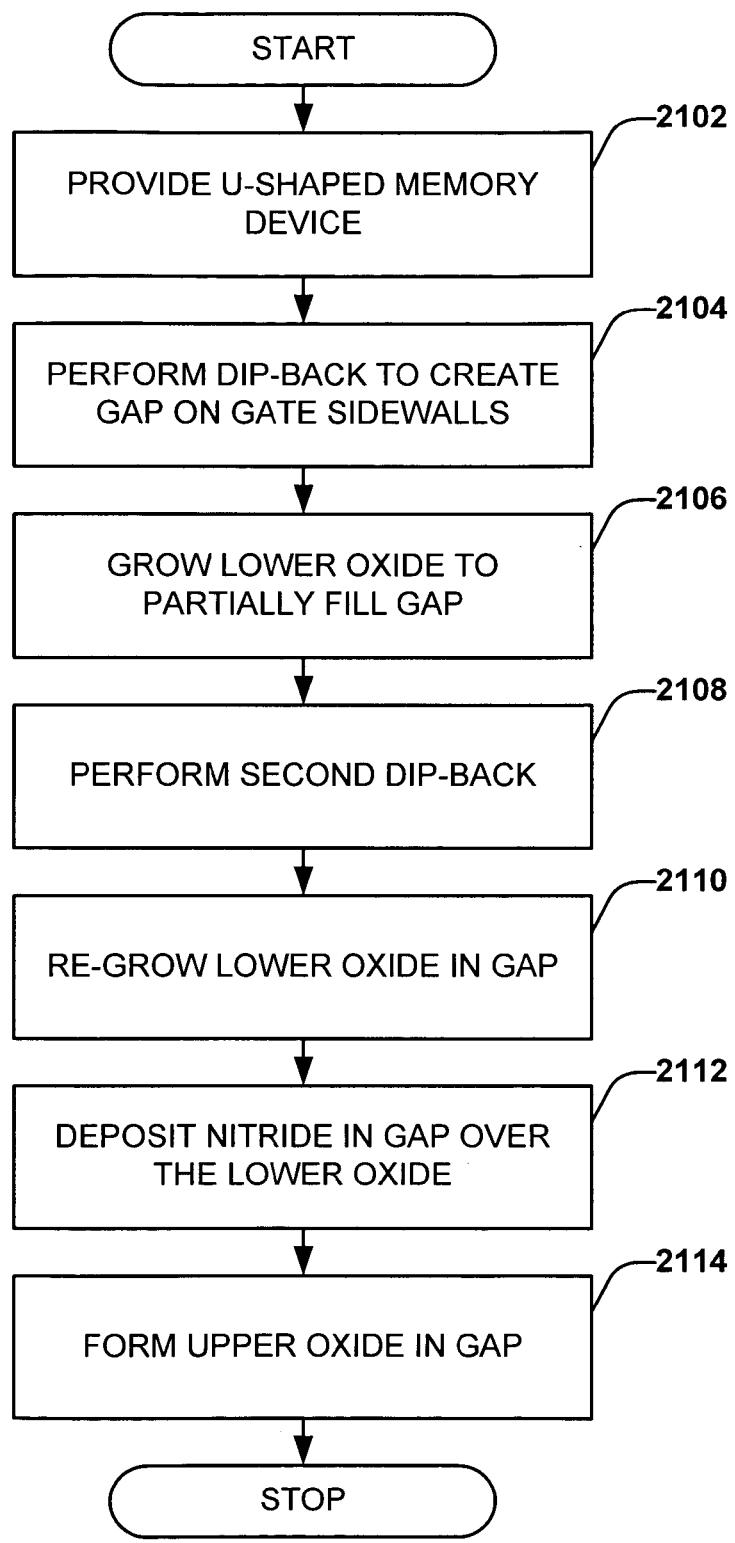
FIG. 21 is a flow diagram illustrating a method of forming and filling a gap region for a separated ONO U-shaped memory device in accordance with an aspect of the present invention.

FIG. 21 is a flow diagram illustrating a method of forming and filling a gap region for a separated ONO U-shaped memory device in accordance with an aspect of the present invention. The method employs a double "dip back" operation on a partially fabricated U-shaped memory device before ONO layer formation to form gap regions and then fills the gap regions with an ONO, charge trapping layer.

The method begins at block 2102 wherein a U-shaped memory device is provided. The device has a polysilicon gate formed within a trench between adjacent source/drain regions. An oxide layer covers a surface of the device and sides and bottom of the polysilicon gates. A wet etch process, also referred to as a "dip back", is performed at block 2104 for a selected period of time to substantially remove the oxide layer from the surface and to remove the oxide layer to a first selected depth on the sidewalls of the polysilicon gate created a gap on the sidewalls. The time is selected to obtain the desired, selected depth.

Subsequently, an oxide layer is grown for a selected period of time that partially fills the gap with the lower oxide layer and covers the surface of the device at block 2106. A second wet etch process, also referred to as a second "dip back" is performed at block 2108 for a second period of time to substantially remove the oxide layer from the surface and to remove the oxide layer to a second selected depth thereby creating the gaps on the sidewalls of the polysilicon gates. The second selected depth is typically lower than the first selected depth. Another oxide layer is grown for a selected period of time that partially fills the gap with the lower oxide layer and covers the surface of the device at block 2110. Nitride is then deposited into the gap by a suitable directed etch process such as chemical vapor deposition (CVD) or low pressure chemical vapor deposition (LPCVD) at block 2112. The nitride may also be deposited over the surface of the device substantially covering the lower oxide deposited previously. An upper oxide layer is then formed on the device thereby covering the deposited nitride in the gap at block 2114, thereby substantially yielding the structure provided in FIG. 16. As with the method of FIG. 20, the nitride can be deposited in two separate steps with an oxidation process in between to form the nitride gaps depicted in FIG. 18.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating a memory device with a recessed channel comprising:
   selectively etching trenches in a semiconductor substrate;
   forming an oxide layer within at least the trenches;
   depositing a first conductive layer over the semiconductor substrate and in the trenches;
   planarizing the device to selectively remove portions of the first conductive layer while leaving portions of the first conductive layer in the trenches to form gates;
   performing one or more bitline implants to form bitlines adjacent to the gates;
   removing portions of the oxide layer located in the trenches adjacent to the gates to a first depth defining gap regions;
   partially filling the gap regions with a lower insulating layer;
   depositing a charge trapping material within at least the gap regions on the lower insulating layer; and
   forming an upper insulating layer on the deposited charge trapping material.

2. The method of claim 1, wherein the deposited first conductive layer is comprised of polysilicon.

3. The method of claim 1, wherein removing portions of the oxide layer comprises performing a wet etch process to remove the portions.

4. The method of claim 1, wherein the deposited lower insulating layer is comprised of oxide and the deposited upper insulating layer is comprised of oxide.

5. The method of claim 1, wherein the charge trapping material deposited is nitride.

6. The method of claim 1, further comprising:
   selectively etching the device to expose an upper surface of the gates; and
   forming a second conductive layer on the device, wherein the second conductive layer is in contact with the gates.

7. The method of claim 6, further comprising forming a third insulating layer over the second conductive layer and planarizing the third insulating layer.

8. The method of claim 7, further comprising etching trenches through the third insulating layer to the bitlines and forming at least partially aligned contacts therein.

9. The method of claim 1, wherein the deposited first conductive layer is doped polysilicon.

10. The method of claim 1, wherein the charge trapping material is nitride and is deposited via a low pressure chemical vapor deposition process.

11. The method of claim 1, wherein the charge trapping material is deposited by depositing a lower portion of the charge trapping material in the gap region, depositing an insulating material in the gap region forming a charge gap, and depositing an upper portion of the charge trapping material.

12. The method of claim 1, wherein the lower insulating layer is also deposited over the bit line regions and the charge trapping layer is also formed on the lower insulating layer over the bitline regions.

13. A method of fabricating a memory device with a recessed channel comprising:
   selectively etching trenches in a semiconductor substrate;
   forming an insulating layer within at least the trenches;
   depositing a first conductive layer over the semiconductor substrate and in the trenches;
   selectively removing portions of the first conductive layer while leaving portions of the first conductive layer in the trenches to form gates;

performing one or more bitline implants to form bitlines adjacent to the gates;

removing portions of the insulating layer located in the trenches adjacent to the gates to a first depth defining gap regions;

partially filling the gap regions with an insulating material;

removing the insulating material from the gap regions and an additional amount of the insulating layer remaining in the trenches to expand the gap regions to a second depth that is greater than the first depth;

forming a lower insulating layer in at least the gap regions;

depositing a charge trapping material within at least the gap regions on the lower insulating layer; and forming an upper insulating layer on the deposited charge trapping material.

14. The method of claim 13, wherein the charge trapping material is nitride.

15. The method of claim 13, wherein the insulating material is oxide.

16. A method of fabricating a memory device with a recessed channel comprising:

forming shallow trench isolation regions in a semiconductor substrate within a periphery region of the device;

selectively etching core trenches in a semiconductor substrate within a core region of the device;

forming an insulating layer within at least the core trenches;

depositing a first conductive layer over the semiconductor substrate and in the trenches;

selectively removing portions of the first conductive layer while leaving portions of the first conductive layer in the trenches to form gates within the core region;

performing a bitline implant to form bitlines within the core region adjacent to the gates;

selectively forming well regions within the periphery region;

removing portions of the insulating layer located in the trenches adjacent to the gates to a first depth defining gap regions;

partially filling the gap regions with a lower insulating layer;

depositing a charge trapping material within at least the gap regions on the lower insulating layer; and forming an upper insulating layer on the deposited charge trapping material.

17. The method of claim 16, further comprising selectively etching portions of the second conductive layer within the periphery region to form gate structures within the periphery region.

18. The method of claim 17, wherein the second conductive layer is doped polysilicon.

* * * * *